United States Patent
Olivieri

(10) Patent No.: US 7,603,610 B2
(45) Date of Patent: Oct. 13, 2009

(54) CODING A VIDEO DATA STREAM WITH UNEQUAL ERROR PROTECTION BASED ACTIVITY

(75) Inventor: Stefano Olivieri, Milan (IT)

(73) Assignee: Koninklijke Philips Electronics N.V., Eindhoven (NL)

( * ) Notice: Subject to any disclaimer, the term of this patent is extended or adjusted under 35 U.S.C. 154(b) by 443 days.

(21) Appl. No.: 10/504,659

(22) PCT Filed: Jan. 20, 2003

(86) PCT No.: PCT/IB03/00127

§ 371 (c)(1),
(2), (4) Date: May 23, 2005

(87) PCT Pub. No.: WO03/069918

PCT Pub. Date: Aug. 21, 2003

(65) Prior Publication Data

US 2006/0090118 A1    Apr. 27, 2006

(30) Foreign Application Priority Data

Feb. 18, 2002   (EP)  ................................... 02075640

(51) Int. Cl.
*G11C 29/00* (2006.01)
(52) U.S. Cl. ...................................... 714/766; 714/752

(58) Field of Classification Search ............ 375/240.16, 375/240.12, 240.26, 240, 240.01–240.04; 714/766, 752

See application file for complete search history.

(56) References Cited

U.S. PATENT DOCUMENTS

| | | | | |
|---|---|---|---|---|
| 5,771,102 | A * | 6/1998 | Vogt et al. | 358/426.02 |
| 5,850,482 | A * | 12/1998 | Meany et al. | 382/232 |
| 5,878,166 | A * | 3/1999 | Legall | 382/232 |
| 6,023,296 | A * | 2/2000 | Lee et al. | 375/240.05 |
| 6,192,077 | B1 * | 2/2001 | Sugiyama | 375/240.12 |
| 6,223,324 | B1 * | 4/2001 | Sinha et al. | 714/776 |
| 6,351,494 | B1 * | 2/2002 | Kondo et al. | 375/240.27 |
| 6,405,338 | B1 * | 6/2002 | Sinha et al. | 714/752 |
| 6,731,685 | B1 * | 5/2004 | Liu et al. | 375/240.14 |
| 6,754,277 | B1 * | 6/2004 | Heinzelman et al. | 375/240.27 |
| 6,876,965 | B2 * | 4/2005 | Mekuria et al. | 704/207 |
| 7,003,038 | B2 * | 2/2006 | Divakaran et al. | 375/240.16 |
| 7,190,732 | B2 * | 3/2007 | Chung et al. | 375/261 |
| 2002/0018565 | A1 * | 2/2002 | Luttrell et al. | 380/217 |
| 2002/0158781 | A1 * | 10/2002 | Martini et al. | 341/59 |
| 2004/0057465 | A1 * | 3/2004 | Chen et al. | 370/474 |

* cited by examiner

*Primary Examiner*—Guy J Lamarre
*Assistant Examiner*—Sam Rizk

(57) ABSTRACT

A method adapted to detect the activity of individual partitions within a packetized frame. The method provides for the encoding of those portions of the data stream having higher activity more than those portions having less activity. This enables a protection differentiation depending on the importance of the data within the specific portion of the stream.

18 Claims, 3 Drawing Sheets

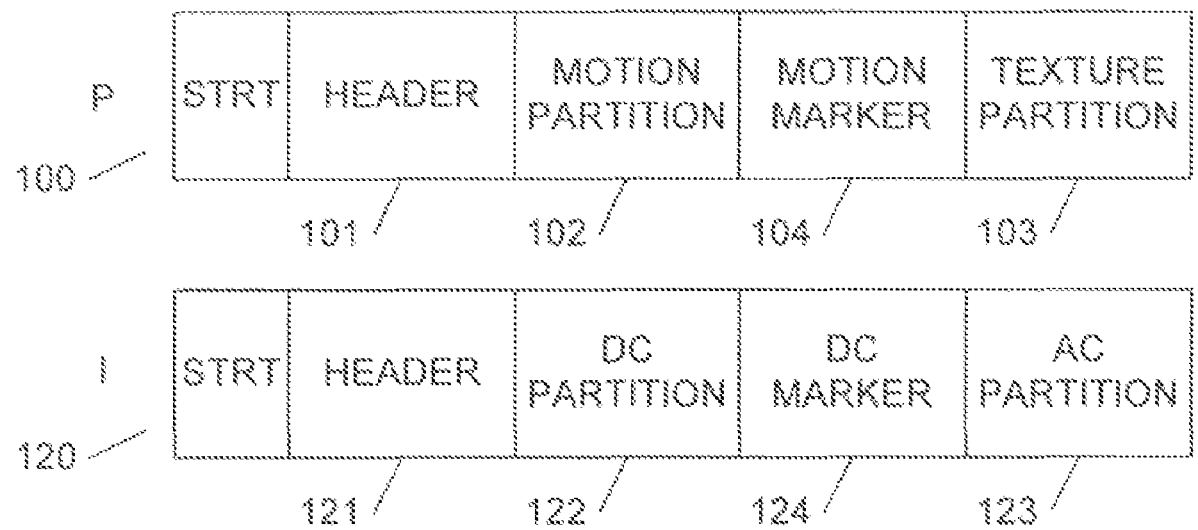
FIG. 1 [PRIOR ART]
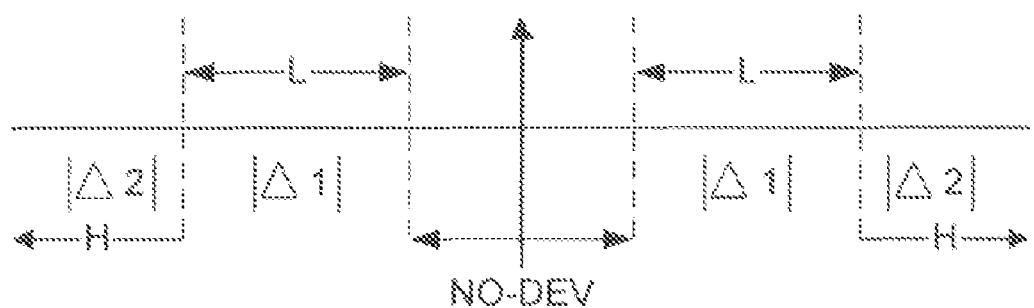
FIG. 2

CODING A VIDEO DATA STREAM WITH UNEQUAL ERROR PROTECTION BASED ACTIVITY

FIELD OF THE INVENTION

The invention relates to coding of a data stream. The invention further relates to the transmission and reception of a coded data stream. The invention particularly relates to a coding scheme for MPEG-4 video using unequal error protection (UEP), and more particularly to a method and system for implementing UEP based on a detection of motion and/or texture activity.

BACKGROUND TO THE INVENTION

Video transmission over a wireless channel suffers from erroneous transmission much more than transmission over a wireline. In a wireless channel, average error rates up to 10% are quite common, resulting in an unacceptable quality of the received video application. It will be appreciated therefore that channel coding is needed in order to bring the bit error rate down to an acceptable level. Classically, after removing the source redundancy, channel coding is performed independently from the source compression scheme, relying on techniques such as Shannon's separation theorem.

However, it will be appreciated that given the considered channel, characterised by tight constraints in term of bandwidth and delay, and given the residual redundancy in the source compression scheme, a joint source-channel coding approach is advisable. More precisely, the channel coding and decoding may take advantage of this residual redundancy. A suitable technique taking into account the characteristics of both the wireless channel and of the application should be thus considered.

Specifically, the information about the different sensitivity of source bits to channel errors should be exploited through Unequal Error Protection. This technique consists in performing error protection according to the perceived sensitivity of source bits to errors: more sensitive bits are protected with a lower rate code, for less important bits a higher rate code is used.

Compared to classical Forward Error Correction, UEP allows achieving a higher perceived video quality given the same bit-rate, through the exploitation of the characteristics of the source. Such a technique is described in EP 1 018 815 of Motorola which describes a method and apparatus for processing information for transmission in a communication system.

This approach can be advantageously combined with the data-partitioning tool available in the MPEG-4 standard, as described in MPEG-4 Video Group, "*Overview of the MPEG-4 Standard*", ISO/IEC JTC1/SC29/WG11 N3444, Geneva, May-June 2000: wherein information bits contained in each packet are separated in three partitions, each of which has a different sensitivity to channel errors. Using the examples illustrated in of FIG. 1 a typical P frame 100 comprises partitions which consist of a packet start STRT preceding a header 101, a motion partition 102 and a texture partition 103, separated by a motion marker 104. Similarly, for I frames 120, partitions comprise a header 121, a DC partition 122 and a AC partition 123 separated by a DC marker 124, and the three partitions are protected using different code rates. The three partitions in each example are protected with different code rates, according to the subjective importance of the relevant information.

Information contained in headers is crucial for the successive decoding of the packet, thus those should be strongly protected. Using the example of the P frame, it will be appreciated that motion data should be more protected than texture data, as if motion information is correctly received texture information may be partially reconstructed, in that without the texture information the decoder can still perform motion-compensated concealment without too much degradation of the reconstructed picture.

The main problem in the application of such a scheme is the fact that packets, like partitions, are not of the same length, thus the UEP scheme should be dynamically changed for each packet and the knowledge of each partition length is required. In order to cope with this problem, techniques using either fixed proportional lengths or lengths read from a field opportunely inserted in the bitstream have been suggested in M. G. Martini, M. Chiani, "*Proportional Unequal Error Protection for MPEG-4 Video Transmission*", proc. IEEE International Conference on Communications (ICC) 2001, pp. 1033-1037, Helsinki, June 2001, and M. G. Martini, M. Chiani, "*Robust Transmission of MPEG-4 Video: Start Codes Substitution and Length Field Insertion Assisted Unequal Error Protection*", Picture Coding Symposium—PCS 2001, Seoul, April 2001.

Although these techniques enable the protection of motion data more than textures data, they still suffer in that no compensation is effected for differing types of motion or textures data. Errors on certain portions of the scene, such as high-motion or highly detailed areas, are more annoying than errors on less active regions, and the known techniques are not adapted to compensate for such variances. There is therefore a need to protect regions with high motion and/or texture activity more than low-active areas.

OBJECT OF THE INVENTION

It is an object of the present invention to provide a system and method that utilises an analysis of the activity of individual partitions and enables a protection of regions with high activity more than low activity areas.

SUMMARY OF THE INVENTION

Accordingly the present invention provides an activity detector and a method to adapt the level of protection to the packet activity. Desirably, the detector and method are adapted to work on the source-coded domain. To this end, the invention provides for coding, transmission, a data stream and a storage medium as defined in the independent claims. Advantageous embodiments are defined in the dependant claims.

The invention is particularly advantageous in the field of wireless transmission of MPEG-4 video. The inventors recognised that portions of the video packet having high activity require more protection than those areas having low activity. For example, in a P frame type the partitions having high motion and/or high texture require more protection than those with areas of low activity, whereas for an I frame type partitions having high DC and/or AC activity require more protection than those having low activity. By applying a coding scheme that recognises and is adaptive to such activity levels the present invention provides an improved protection for data streams.

These and other features of the present invention will be better understood with reference to the following drawings which are exemplary of the present invention.

BRIEF DESCRIPTION OF THE DRAWINGS

FIG. 1 shows examples of data partitioning of an MPEG-4 packet,

FIG. 2 shows a quantization of packet activity deviation, according to the present invention.

DETAILED DESCRIPTION OF THE DRAWINGS

Figure 3:
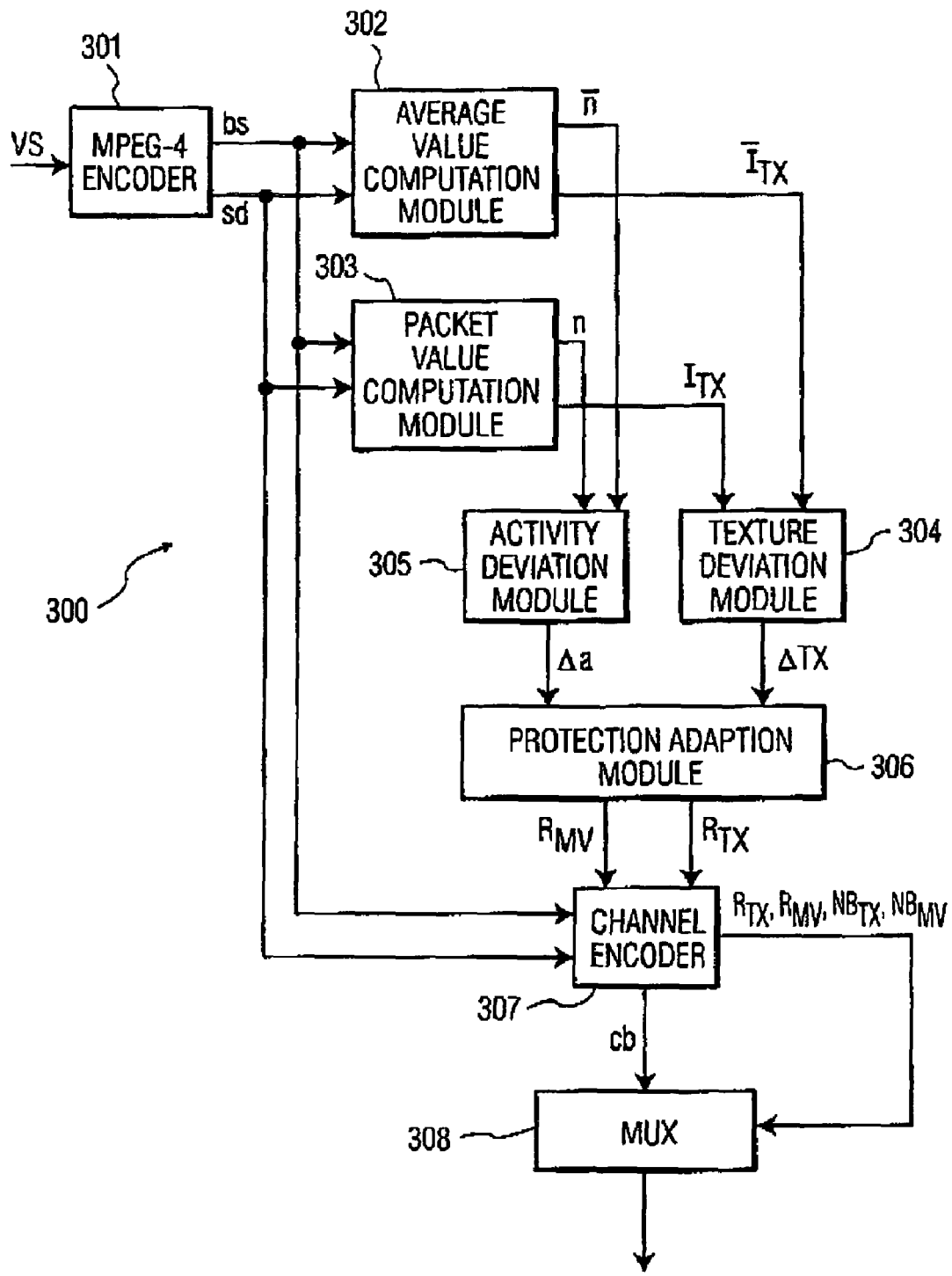
FIG. 3 shows a transmission system according to the present invention.

FIG. 1 has shown the data partitioning of frames according to the MPEG-4 standard.

It is a known integer of the MPEG-4 format that a video packet approach is incorporated wherein the video packet length is not based on the number of blocks, but instead on the number of bits contained in that packet. If the number of bits contained in the current video packet exceeds a predetermined threshold, then a new video packet is created at the start of the next block.

The present invention provides a method that utilises this implication that packets associated to more active regions in terms of motion and/or textures contain a smaller number of blocks. Using the example of a P frame that is partitioned into B fixed-size blocks it may be assumed that the number of video packets associated with the current frame is N. The average number of blocks per packet is then given by $$\bar{n} = \frac{B}{N} \quad (1)$$

which represents the average motion and texture activity per packet. Therefore, the activity deviation of any measured MPEG-4 video packet from the average value may be defined as $$\Delta_a = \bar{n} - n \quad (2)$$

where n is the actual number of blocks contained in the current measured packet. The current packet is characterised by greater activity than the average if $\Delta_a > 0$, less than the average otherwise.

According to the present invention a technique to detect if the activity of the current packet is mainly due to motion or texture may also be defined.

Let NBF be the total number of bits after a video sequence comprising a P frame has been encoded using an MPEG-4 encoder, and let $L_{TX}$ and $L_{MV}$ indicate the total number of coded bits associated to the textures and the motion vectors, respectively. Therefore, the average portion of the texture section with respect to the video packet is $$\bar{l}_{TX} = \frac{L_{TX}}{NBF} \quad (3)$$

whereas $$\bar{l}_{MV} = \frac{L_{MV}}{NBF} \quad (4)$$

is the average portion of the motion vector section compared to the same packet.

By neglecting the header sections, the following $$\bar{l}_{TX} \cong 1 - \bar{l}_{MV} \quad (5)$$

holds. Let $$l_{TX} = \frac{NB_{TX}}{NBP} \quad (6)$$

be now the actual portion of the texture section compared to the current packet, where $NB_{TX}$ is the number of bits associated to the textures and NBP is the packet length, and let us define $$\Delta_{TX} = l_{TX} - \bar{l}_{TX} \quad (7)$$

representing the deviation from the average value of the portion of the texture partition for the current packet.

Then, the packet activity is mainly due to textures if $\Delta_{TX} > 0$, and to motion if $\Delta_{TX} < 0$.

In order to adapt the protection level to the activity of the packet, the range of $\Delta_a$ may be quantized. In this way, different activity deviation levels may be defined according to the decision region in which $\Delta_a$ falls.

FIG. 2 shows an example of a quantization of the packet activity deviation and it will be appreciated that the decision regions have been defined so that there may be (either positive or negative) low (L) or high (H) activity deviation compared to the average value. A no-deviation region has also been defined, meaning that the activity of the current packet is comparable to the average activity value.

When significant activity deviation occurs (i.e. $\Delta_a$ falls outside the no-deviation region), the dominance of texture or motion activity has to be detected. It is reasonable to fix a threshold $\Delta'_{TX}$ such that if $\Delta_{TX} > \Delta'_{TX}$ the activity is due to texture, whereas if $\Delta_{TX} < -\Delta'_{TX}$ the activity is due to motion. It is assumed that no activity dominance occurs if $|\Delta_{TX}| < \Delta'_{TX}$, where $\Delta'_{TX}$ is a threshold which may be experimentally determined. It will be appreciated by those skilled in the art that this threshold value may be determined in one of many different ways. For example a possible way to determine the value of this threshold is to maximise the video quality performance improvement compared to the non-adaptive technique using the same amount of bandwidth to protect the information. This tuning may be performed over a number of test sequences. Then, the value of this threshold may be used indefinitely for future application.

Let us suppose now that the motion vector partition has to be protected with rate $R_{MV}$, and that the texture partition is protected with rate $R_{TX}$, according to a UEP technique which assigns different coding rates to different partitions.

Table 1 summarises the mechanism to adapt the protection of motion and texture partitions to the packet activity.

TABLE 1

| Protection levels according to partition activity. | | | |
|---|---|---|---|
| $\Delta_a$ | $\Delta_{TX}$ | motion | textures |
| $|\Delta_a| < \Delta_1$ | | $R_{MV}$ | $R_{TX}$ |
| $\Delta_1 < \Delta_a < \Delta_2$ | $|\Delta_{TX}| < \Delta'_{TX}$ | $R^2_{MV}$ | $R^2_{TX}$ |
|  | $\Delta_{TX} > \Delta'_{TX}$ | $R_{MV}$ | $R^2_{TX}$ |
|  | $\Delta_{TX} < -\Delta'_{TX}$ | $R^2_{MV}$ | $R_{TX}$ |
| $\Delta_a > \Delta_2$ | $|\Delta_{TX}| < \Delta'_{TX}$ | $R^1_{MV}$ | $R^1_{TX}$ |
|  | $\Delta_{TX} > \Delta'_{TX}$ | $R_{MV}$ | $R^1_{TX}$ |
|  | $\Delta_{TX} < -\Delta'_{TX}$ | $R^1_{MV}$ | $R_{TX}$ |
| $-\Delta_2 < \Delta_a < -\Delta_1$ | $|\Delta_{TX}| < \Delta'_{TX}$ | $R^3_{MV}$ | $R^3_{TX}$ |
|  | $\Delta_{TX} > \Delta'_{TX}$ | $R^3_{MV}$ | $R_{TX}$ |
|  | $\Delta_{TX} < -\Delta'_{TX}$ | $R_{MV}$ | $R^3_{TX}$ |

TABLE 1-continued

Protection levels according to partition activity.

| $\Delta_a$ | $\Delta_{TX}$ | motion | textures |
|---|---|---|---|
| $\Delta_a < -\Delta_2$ | $|\Delta_{TX}| < \Delta'_{TX}$ | $R^4_{MV}$ | $R^4_{TX}$ |
| | $\Delta_{TX} > \Delta'_{TX}$ | $R^4_{MV}$ | $R_{TX}$ |
| | $\Delta_{TX} < -\Delta'_{TX}$ | $R_{MV}$ | $R^4_{TX}$ |

Note that $R^1_{MV} < R^2_{MV} < R_{MV} < R^3_{MV} < R^4_{MV}$, and that $R^1_{TX} < R^2_{TX} < R_{TX} < R^3_{TX} < R^4_{TX}$.

It will be appreciated that the present invention additionally provides for an additional level of protection to be assigned to motion as opposed to texture partitions such that $R_{MV} > R_{TX}$. Thus it will be appreciated that the present invention provides for a hierarchy in protection levels such that partitions having motion data therein are protected more than those partitions having texture and those partitions having high levels of motion activity are protected more than those having less activity.

It will be appreciated by the person skilled in the art that the same or similar technique could be applied to Intra frames. In this case, DC DCT coefficients and AC coefficients partitions have to be considered for activity dominance detection, and areas having higher activity will be assigned more protection than those areas having lesser activity FIG. 3 shows a schematic of a transmission circuit 300 for encoding a video sequence according to the present invention. A video sequence vs is provided as an input to an MPEG-4 encoder 301 where it is separated into its constituent bitstream bs and MPEG-4 syntax description sd. Both the bitstream and the syntax description are provided to an average value computation module 302 where the average number of blocks $\bar{n}$, and the average portion of the texture section with respect to the video packet $\bar{l}_{TX}$ are evaluated. Similarly the bitstream and syntax description are provided to a packet values computation module 303, where the actual number of blocks in the current packet (n) and the actual portion of the texture section compared to the current packet ($l_{TX}$) are measured.

The average value and actual value of both the texture and activity are then evaluated in texture deviation 304 and activity deviation 305 modules. The amount of deviation is then compared to empirically determined quanta in a protection adaptation module 306 and this will determine the type of protection to be applied to each of partitions. The computed protection level for each of the partitions is then applied to the respective bit stream and syntax description in a channel encoder 307 which provides as an output a coded bitstream cb.

This coded bitstream is then suitably multiplexed with the syntax description ($R_{MV}$, $R_{TX}$, $NB_{MV}$ and $NB_{TX}$) using a multiplexer 308, and this multiplexed signal is then transmitted.

Figure 4:
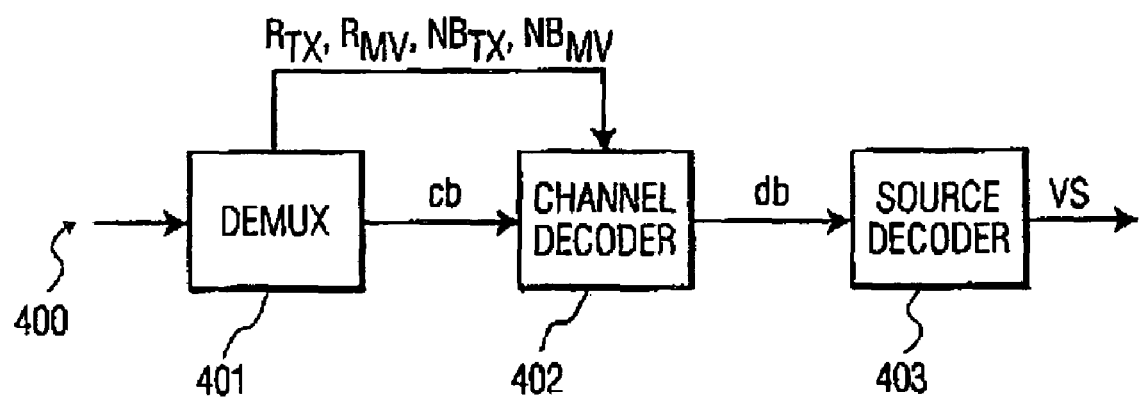
FIG. 4 shows a decoding system for use in decoding data streams encoded using the method of the present invention.

FIG. 4 shows an example of a suitable receiving circuit 400 which is adapted to receive the multiplexed signal and decode it for viewing purposes. The bitstream is received and then demuxed using a demuxer 401. This extracts the syntax description from the coded bitstream which is then processed using a channel decoder 402 so as to form a decoded bitstream. This decoded bitstream is then converted into a video sequence for display using a source decoder 403. This it will be appreciated may be effected using generic MPEG-4 decoders or alternative decoders depending on the application of the method of the present invention to a specific data stream type.

It should be noted that the above described embodiment illustrates rather than limits the invention and that those skilled in the art will be able to design many alternative embodiments without departing from the scope of the appended claims. In the claims any reference sign placed between parentheses should not be construed as limiting the claim. Similarly, the words "comprises/comprising" and the words "having/including" when used herein with reference to the present invention are used to specify the presence of stated features, integers, steps or components but does not preclude the presence or addition of one or more other features, integers, steps, components or groups thereof. The invention may be implemented by means of hardware comprising several distinct elements, and by means of a suitably programmed computer. In a device claim enumerating several means, one or more of these means may be embodied by one and the same item of hardware. The mere fact that certain measures are recited in mutually different dependant claims does not indicate that a combination of these measures cannot be used to advantage.

The invention claimed is:

1. A method of coding a data stream on an encoding apparatus, the data stream comprising a frame having at least one packet having partitions, the method comprising:
    comparing the activity level of the at least one packet to an average activity level of the frame to determine an error protection rate for each of the partitions of the at least one packet, and
    coding respective partitions with the determined error protection rates, and
    outputting the data stream with the respective partitions of the at least one packet coded with the different error protection rates.

2. The method as claimed in claim 1 wherein the activity of the packet is determined by measuring the number of blocks in the packet and comparing that measured number of blocks to an average number of blocks per packet for the frame.

3. The method as claimed in claim 2 wherein on comparison of the actual number of blocks measured to the average number of blocks a deviation value is evaluated, and the deviation value is compared to predetermined activity deviation levels so as to determine a suitable error protection rate to be applied to the partitions within the packet.

4. The method as claimed in claim 1 further comprising-measuring whether the activity within the packet is due to motion or texture, the method comprising:
    determining an average value for the texture section with respect to the frame,
    determining an actual value for the texture section with respect to the at least one determining a variance between the actual value measured and average value, and
    assigning the packet activity as being mainly due to texture if the actual value is greater than the average value.

5. The method as claimed in claim 1 further comprising measuring whether the activity within the packet is due to DC or AC components, the method comprising:
    determining an average value for the DC component section with respect to the frame,
    determining an actual value for the DC component section with respect to the at least one packet,
    determining a variance between the actual value measured and average value, and
    assigning the packet activity as being mainly due to the DC component if the actual value is greater than the average value.

6. The method as claimed in claim 1 wherein the data stream is an MPEG-4 data stream.

7. An encoder for coding a data stream, the data stream comprising a frame having at least one packet having partitions, the system comprising:
- means for forming a first and second data segment from the frame,
- means for evaluating an average value for the activity of the first and second data segment for the frame,
- means for evaluating an actual value for the activity of the first and second data segment for each of the at least one packets within the frame,
- means for comparing the values resultant from the means for evaluating an average value and means for evaluating an actual value, and
- means for encoding the frame by applying an error protection rate to each partition of the least one packet, the error protection rate chosen for each partition of the at least one packet on the basis of the output of the means for comparing.

8. An encoding system comprising:
- a computation system that is configured to determine an activity level of each partition of a packet and a nominal activity level of all partitions of a plurality of packets,
- a deviation system that is configured to determine one or more deviations of the activity level of each partition of the packet relative to the nominal activity level,
- a protection determination system that is configured to determine one or more protection levels based on the one or more deviations, and
- a channel encoder that is configured to encode the packet based on the one or more protection levels.

9. The encoding system of claim 8, wherein the activity level is based on a number of partitions in the packet.

10. The encoding system of claim 8, wherein the nominal activity level is based on an average number of partitions in the plurality of packets.

11. The encoding system of claim 8, including an MPEG encoder that is configured to provide the plurality of packets.

12. The encoding system of claim 11, wherein the plurality of packets, including the packet, corresponds to a frame of video data.

13. The encoding system of claim 12, wherein the one or more deviations include an activity deviation and a texture deviation associated with an MPEG P-frame.

14. The encoding system of claim 12, wherein the one or more deviations include a DC deviation and an AC deviation associated with an MPEG I-frame.

15. The encoding system of claim 8, wherein the channel encoder is configured to encode the packet using a bit rate that decreases as the protection level increases.

16. A method comprising:
- determining an activity level associated with at least one partition in a packet,
- determining a nominal activity level associated with a plurality of packets, and
- encoding each partition in the packet using a protection level that is based on a comparison of the activity level of the partition in the packet and the nominal activity level.

17. The method of claim 16, wherein encoding the packet includes using a bit rate that decreases as the activity level increases.

18. The method of claim 16, wherein the plurality of packets, including the packet, corresponds to a frame of video data.

* * * * *